United States Patent
Laufenberg

(10) Patent No.: US 8,378,532 B2
(45) Date of Patent: Feb. 19, 2013

(54) ACTUATOR APPARATUS RESPONSIVE TO ELECTRICAL ACTIVATION

(75) Inventor: Markus Laufenberg, Radolfzell (DE)

(73) Assignee: ETO MAGNETIC GmbH, Stockach (DE)

(*) Notice: Subject to any disclaimer, the term of this patent is extended or adjusted under 35 U.S.C. 154(b) by 397 days.

(21) Appl. No.: 12/727,324

(22) Filed: Mar. 19, 2010

(65) Prior Publication Data

US 2010/0242673 A1   Sep. 30, 2010

(30) Foreign Application Priority Data

Mar. 25, 2009 (DE) .......................... 10 2009 014 304

(51) Int. Cl.
*H02N 2/00* (2006.01)
*H02K 33/00* (2006.01)

(52) U.S. Cl. ........................................... 310/26; 310/15

(58) Field of Classification Search .................... 310/26, 310/306, 307

See application file for complete search history.

(56) References Cited

U.S. PATENT DOCUMENTS

| 6,404,098 | B1 | 6/2002 | Kayama et al. |
| 2006/0044093 | A1 | 3/2006 | Ohta et al. |
| 2006/0175912 | A1* | 8/2006 | Mori et al. ....................... 310/26 |

FOREIGN PATENT DOCUMENTS

| JP | 04054879 A | * | 2/1992 |
| JP | 05236595 A | * | 9/1993 |
| JP | 05344767 A | * | 12/1993 |
| JP | 2000297566 | | 10/2000 |
| WO | 03/019582 | | 6/2003 |

OTHER PUBLICATIONS

JP 05-236595A Machine Translation, Jun. 12, 2012.*
JP 05-344767 Machine Translation, Jun. 12, 2012.*
German Office Action for DE 10 2009 014 304.1-24.

* cited by examiner

*Primary Examiner* — Quyen Leung
*Assistant Examiner* — Thomas Truong
(74) *Attorney, Agent, or Firm* — Bachman & LaPointe, P.C.

(57) ABSTRACT

Actuator apparatus having a drive element (26) which can tilt and/or pivot in a predetermined manner in response to electrical activation and which is formed such that it can be contacted by an output partner in order to transmit mechanical drive energy, wherein the drive element, as a connection element, is operatively connected to two expansion units (10, 12; 40, 42), which are formed by means of magnetic shape-memory alloy material, such that the connection element executes a tilting and/or pivoting movement in response to an expansion or contraction movement of one of the expansion units, expansion or contraction movement being produced by the electrical activation and also a magnetic field which is generated by said electrical activation.

11 Claims, 2 Drawing Sheets

ACTUATOR APPARATUS RESPONSIVE TO ELECTRICAL ACTIVATION

BACKGROUND OF THE INVENTION

The present invention relates to an actuator apparatus having a drive element which can tilt and/or pivot in a predetermined manner in response to electrical activation and which is formed such that it can be contacted by an output partner in order to transmit mechanical drive energy.

An apparatus of this type is generally known from the prior art and is used, for example, in connection with rotary actuation tasks.

Reference is made, by way of example, to WO 03/019582 A1 as the prior art which forms this generic type. Said document describes an electromagnetic rotary actuator which is used, in particular, in the automotive industry for moving a throttle valve for internal combustion engines. In this known prior art, a drive element in the form of a tilting or pivoting lever is held such that it can rotate about a bearing shaft, and, in response to a suitable supply of power to the coil system, the pivotable drive element is moved to a desired tilting position. In this case, the operating principle is based on a resonant switching principle using springs, for example helical springs, and, in the exemplary embodiment, renders possible rotary displacement of approximately 40° with a typical switching time in the range of between 2 and 3 ms.

The disadvantage of a known apparatus of this type is initially the high level of structural outlay; four coils have to be used in the abovementioned prior art in order to move a relatively large rotary armature as the drive element. High-frequency activation is also necessary for the known resonance principle, associated additional control-related expenditure and also a predetermined pivoting or end position of the drive element only have to be maintained when the coil system is acted on by a permanent holding current (also for overcoming the spring forces).

Accordingly, the object of the present invention is to simplify the design of an actuator apparatus which produces a tilting and/or pivoting movement of a drive element, in particular to reduce the mechanical and control-related expenditure while at the same time rendering possible a rapid switching (tilting and/or pivoting) process and providing the preconditions for a large number of actuator positions to be kept in the powerless state, that is to say the drive element remains at a predetermined tilting and/or pivoting angle as a rotary position, even if not electrically activated.

SUMMARY OF THE INVENTION

The object is achieved by actuator apparatus having a drive element which can tilt and/or pivot in a predetermined manner in response to electrical activation and which is formed such that it can be contacted by an output partner in order to transmit mechanical drive energy, characterized in that the drive element, as a connection element, is operatively connected to two expansion units, which are formed by means of magnetic shape-memory alloy material, such that the connection element executes a tilting and/or pivoting movement in response to an expansion or contraction movement of one of the expansion units, said expansion or contraction movement being produced by the electrical activation and also a magnetic field which is generated by said electrical activation.

According to the invention, the drive element is advantageously tilted and/or pivoted as desired (or moved to the associated tilting and/or pivoting position) by two expansion units, said expansion units each having a magnetic shape-memory alloy material which expands or contracts (typically longitudinally) in response to the electrical activation and a magnetic field which is generated by said electrical activation. According to the invention, this movement of the expansion units is then mechanically transmitted to the drive element such that the tilting and/or pivoting movement which is desired and intended according to the invention is realized.

According to the invention, this is mechanically and structurally drastically simplified compared, for example, to the procedure discussed above in relation to the prior art which forms this generic type, and furthermore the present invention can provide, as will be explained in detail further below, a bistable effect in a simple and elegant manner, this bistable effect making it possible for a large number of tilting and/or pivoting positions to be assumed without power being supplied (that is to say without the need for an electrically generated magnetic field having to keep an expansion unit and therefore the drive element in one position).

In this case, it is preferred, according to the invention, for the drive element to be designed as a tilting lever which can be pivoted about a rotary shaft and for the expansion units to be acted on at both ends of the rotary shaft such that the tilting and/or pivoting movement can be set and reset by in each case one of the pair of expansion units. Therefore, a hypothetical tilting and/or pivoting angle of up to 180° can be formed by suitably designing the (lifting) geometries, it being expedient here to set up a pivoting angle (angular travel) of between 45° and 90° within the scope of the invention and in order to realize the applications, which are advantageous according to the development, of the rotary actuator system, for example in the motor-vehicle or air-conditioning sector.

It is also preferred, according to the development, to realize a bistable effect of the present invention by, with the aid of a permanent unit, that is to say for example permanent magnets which can be associated with one or both of the expansion units and have a correspondingly fixed magnetic field, it being possible to set up or set positions, it then being possible for these positions to be suitably influenced by superimposition or neutralizing effects of an additional electromagnetic field which is generated by the electrical activation. Depending on the configuration, it is thus possible to either render possible bistable operation with regard to the respective end positions of the tilting and/or pivoting movement, or else to form predetermined intermediate positions in a stable manner without power, or to realize an actuation operation which is proportional to the activation.

In this case, it is expedient, within the scope of a first preferred embodiment, for each of the expansion units to have associated coil means as a magnetic field unit, so that, in particular from the point of view of modularization, suitable expansion units, which may possibly be simple to produce on a large scale, can be suitably selected, positioned and activated for actuation purposes.

As an alternative, it is possible to jointly provide a coil unit (that is to say, for example, a magnetic field coil pair) for a plurality of expansion units in order to further reduce the apparatus outlay in this respect. An analogous actuation and/or switching behavior can be achieved, in particular in conjunction with permanent magnet means which can be associated with at least one of the expansion units, as can virtually any desired configuration options depending on the respective intended dimensioning and use.

Whereas it is expedient and preferred, according to the invention, to use the present invention for rotary actuation tasks in the field of motor-vehicle and/or air-conditioning engineering, the range of application of the principle claimed by the present invention is, in principle, unlimited; instead, it can be assumed that both the apparatus and the method, according to the invention, which can be identified from the present document can be used for any desired rotary actuation purposes in which mechanically simple design with short switching times, high tolerance to environmental conditions and reliable operation have advantageous effects.

BRIEF DESCRIPTION OF THE DRAWINGS

Further advantages, features and details of the invention can be found in the following description of preferred exemplary embodiments and with reference to the drawings, in which.

DETAILED DESCRIPTION

Figure 1:
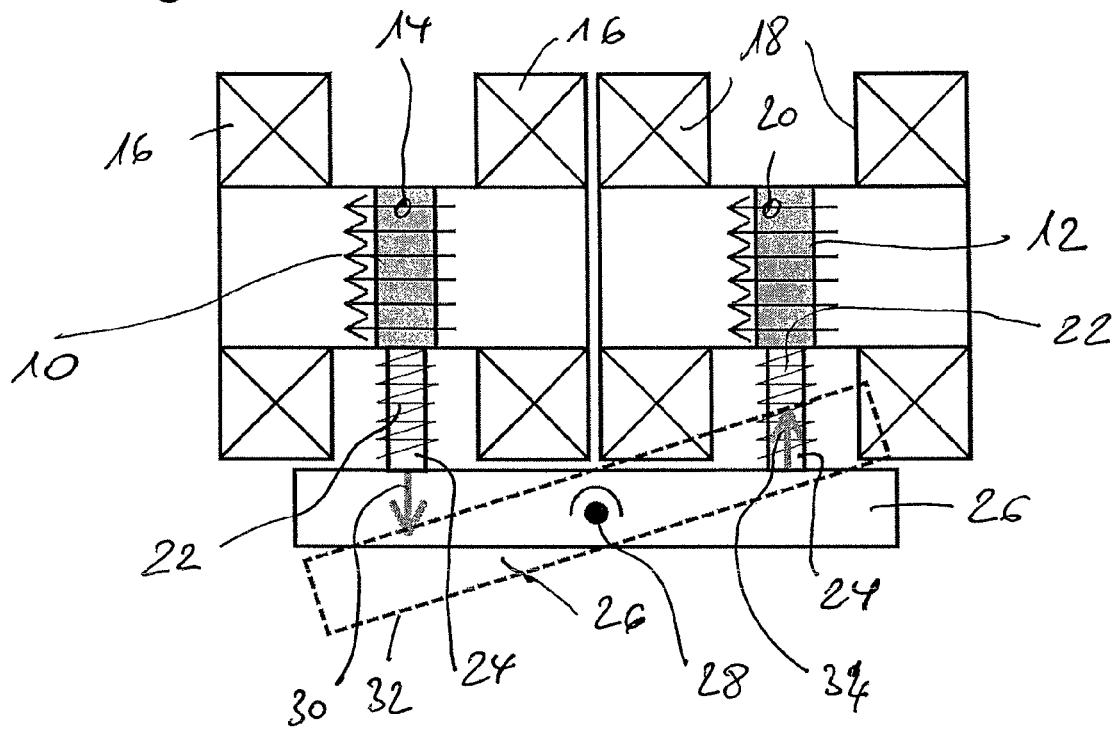
FIG. 1 shows a schematic view of an actuator apparatus according to a first exemplary embodiment of the present invention, with a pair of expansion units which are of symmetrical design and are symmetrically activated and, at both ends of a rotary shaft, act on a tilting lever, which is pivotably mounted on said rotary shaft, as a drive element.

FIG. 1 illustrates, in the schematic illustration through a longitudinal section, the manner of operation of a first exemplary embodiment. A pair of expansion units 10, 12 is realized by means of a magnetic shape-memory alloy material (for example NiMnGa (as a mono-, multi- or polycrystal), magnetic field strength of approximately 1T). Materials of this type are known from the prior art and are distinguished in that they experience a change in length in response to an applied magnetic field; in practice, this change in length is typically approximately 4% to 6%, up to approximately 10%, of the elongation of such a material in relation to the extension direction.

As shown in FIG. 1, the shape-memory alloy material 10 can be expanded by a magnetic field (group of arrows 14), this magnetic field being generated by a coil pair 16 in response to an electrical activation. Analogously, a second coil pair 18 generates a magnetic field (group of arrows 20) for the second expansion unit 12.

As can additionally be seen in FIG. 1, the (initially linear) actuating action of the expansion units is coupled to a tilting and/or pivoting lever 26, which is mounted such that it can tilt and/or pivot about a stationary rotary shaft 28 and serves as a drive element for an output partner (that is to say, for example, an air-control valve for a vehicle interior), against the force of a respectively associated compression spring 22 (for setting a force or movement operating point) and in a manner mechanically coupled by means of a tappet unit 24 which extends in the expansion direction of the units 10 and 12.

In response to, for example, power being supplied to the coil unit 16, the shape-memory alloy material of the first expansion unit 10 would, during operation of the unit according to FIG. 1, carry out a predetermined expansion movement in the direction of arrow 30, with the result that, by force being applied to the lever 26, said lever is moved into a pivoted position, indicated by the dashed line according to reference numeral 32. In this operating state, the coil unit 18 is preferably not supplied with power, and therefore a magnetic field is not applied to the expansion unit 12; instead, said expansion unit is contracted by the mechanical action of force along arrow 34 by the lever 26 (in its position 32). A corresponding reversal in polarity or exchanged activation would then analogously cause a tilting and/or pivoting of the lever 26 in the opposite direction of rotation.

Figure 2:
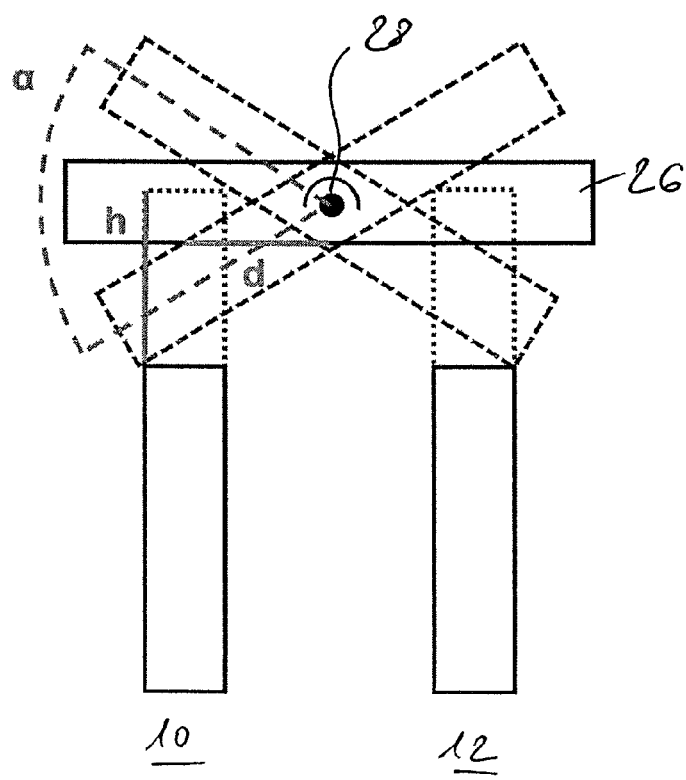
FIG. 2 shows a schematic illustration for illustrating the movement geometry of the exemplary embodiment according to FIG. 1.

FIG. 2 illustrates the tilting or lever geometry of an arrangement of this type: said figure again shows how the pair of expansion units 10, 12 mechanically interact with the tilting lever 26 (requisite magnetic field means are not shown in FIG. 2) and it can be seen that, in order to realize an effective tilting and/or pivoting movement a (of, for example, 60°, as shown in FIG. 2), this geometry is determined firstly by a magnetic field-induced change h in length of each of the expansion units, and secondly by a free limb length d of the pivoting lever 26, measured from the pivoting shaft 28 up to the effective point of contact with one of the expansion units (the extension, illustrated in dashed lines, of the units 10, 12 illustrates the expanded, stretched operating state).

In addition to the geometry shown in FIG. 2, an expansion or stretching force of the units 10, 12, which (in a manner induced by the physical behavior of the shape-memory alloy material used) is approximately proportional to the material cross section of the respective expansion units perpendicular to the stretching direction, is important for dimensioning. The combination of the expansion force, which can be dimensioned in this way, in conjunction with the lever geometry d therefore permits a desired torque about the rotation shaft 28 to be measured and set up.

As illustrated in the above description of FIG. 1, the use of compression or return springs 22 is not necessary in principle. However, an operating mode of an arrangement according to FIG. 1, according to which both coils are supplied with power at the same time (but at different levels), and therefore proportional behavior of the rotary actuator can be achieved, that is to say any desired intermediate angle is achieved, by means of suitable power regulation (and therefore setting of the magnetic fields 14, 20), is feasible. The above description also shows that the arrangement is bistable when power is not supplied, that is to say, the tilting lever 26, as the drive element, remains in a respective end position (that is to say, for example, with a stretched first expansion element and contracted second expansion element, and vice versa), without a magnetic field needing to applied and therefore without power needing to be supplied to the coil units 16 and/or 18 in one of these end positions.

A second exemplary embodiment of the invention is described below with reference to FIGS. 3 and 4.

A pair of expansion units 40, 42 comprising a magnetic shape-memory alloy material again interacts with a drive element 26, which is pivotably mounted as a tilting lever, with the interposition of tappet units 24; the respective (intermediate) positions are controlled in a stable manner without power being supplied or with reduced power.

However, in contrast to the exemplary embodiment of FIG. 1, the pair of expansion units are jointly acted on by a coil pair 44 with an electrically induced magnetic field, indicated by the group of solid-line arrows 46.

In addition, the permanent magnetic field of permanent magnets 48 and 50 acts on each of the expansion units, said permanent magnets being associated with the expansion unit 40 or 42 in the shown manner and each exerting a permanent magnetic field on the shape-memory alloy material, said permanent magnetic field being indicated by the arrows 52 (for the permanent magnet 48) and 54 (for the permanent magnet 50) which are illustrated in dashed lines.

The manner of operation of this arrangement is explained below with reference to the movement/magnetic field graph in FIG. 4, where it is assumed that a permanent magnetic field of field strength $B_0$ is generated by the permanent magnets 48 and 50. The polarity, which alternates due to current pulses, can now be achieved in that the expansion units alternately expand and contract again in the extension direction (arrow direction 56 for expansion, 58 for contraction), the springs 22 which are again indicated schematically generating an intentional mechanical prestress.

Therefore, under the permanent magnetic biasing fields $+B_0$ and $-B_0$, the units 40 and 42 are in their starting position: the right-hand expansion unit 42 is extended (position 60 in FIG. 4), the left-hand expansion unit 40 is compressed (position 62). A power supply pulse for the coil pair 44, which generates a coil field of field strength $B_{SP} \approx B_0$, leads to a field of strength $-B_0 + B_{SP} \approx 0$ being applied to the unit 42, and, in contrast, a field of strength $B_0 + B_{SP} \approx 2B_0$ being applied to the unit 40. Accordingly, unit 42 moves, in the direction of arrow pair 64 in FIG. 4, from position 60 to position 66, and unit 40 moves from position 60 to position 68. This has the effect that the unit 40 (due to the action of the prestressing spring 22) is compressed, whereas unit 42 is extended at the same time, with the result that, after the end of the pulse, an inverse movement state 70, 72, which is pivoted in an opposite end state, is achieved compared to the initial state 60, 62.

Figure 4:
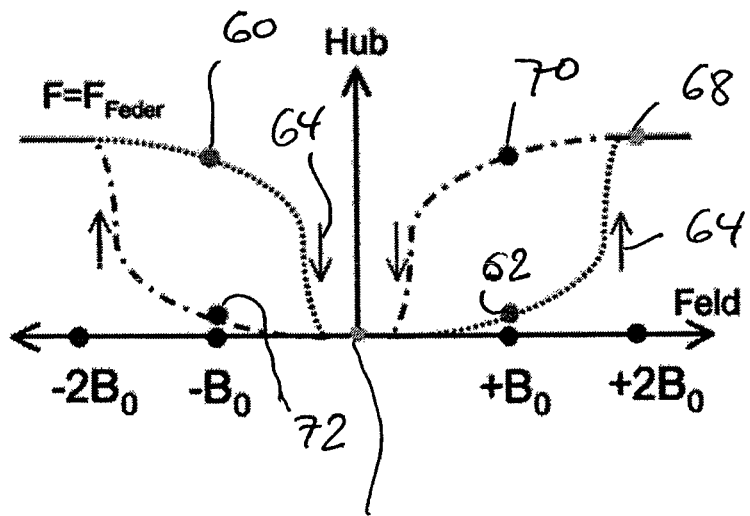
FIG. 4 shows a magnetic field/movement graph for illustrating the manner of operation of the exemplary embodiment according to FIG. 3.

Analogous behavior in the opposite direction is achieved, with the hysteresis pattern shown in FIG. 4, by virtue of a current pulse to the coil unit 44, this current pulse producing a coil field $B_{SP} = -B_0$.

The actuator is again stable in both end positions without any power being supplied at all, as long as, for example, material-specific force limits are not exceeded.

Figure 3:
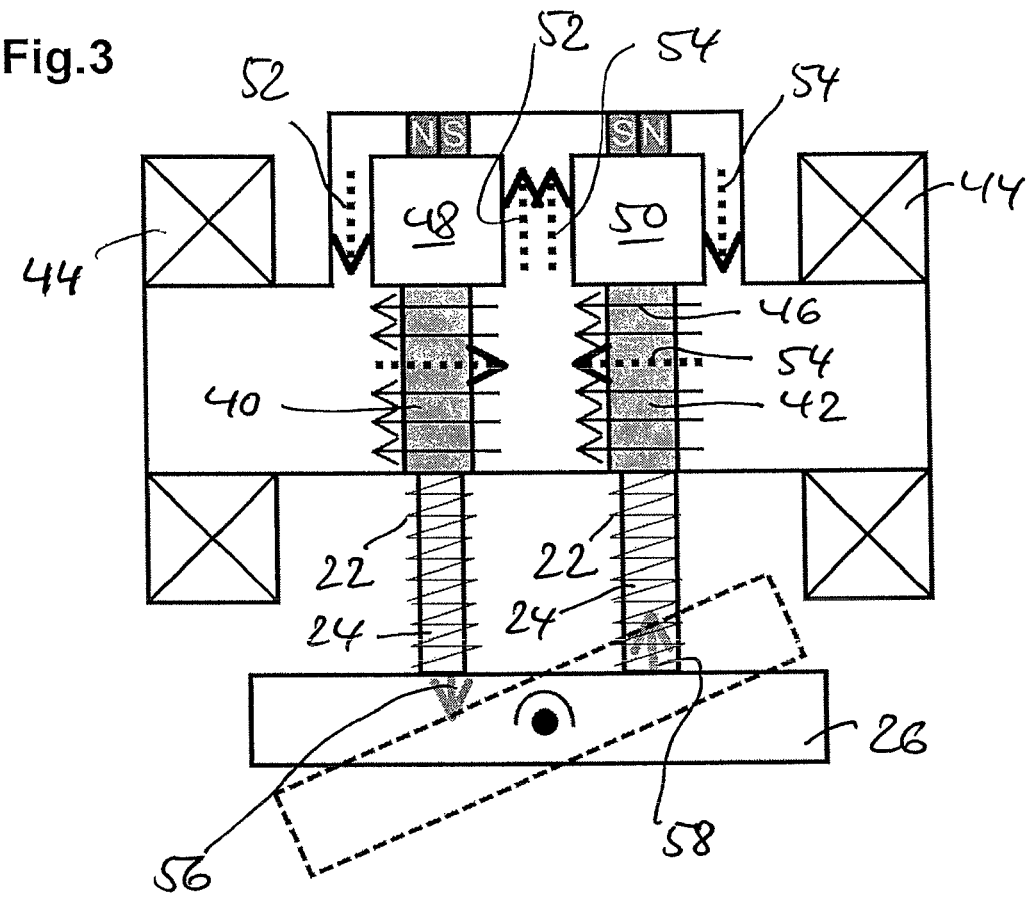
FIG. 3 shows a schematic illustration of an actuator apparatus according to a second exemplary embodiment of the invention, in which an electromagnetic coil unit is jointly provided for a pair of expansion units, said expansion units additionally having associated permanent magnets.

Further modifications, in particular the arrangement according to FIG. 3, are possible within the scope of the present invention.

According to an additional development (not shown in the figures), it is feasible for the coil field which is to be produced by electrical activation to be realized with just one coil (which may then have to be larger). Equally, the permanent magnets 48 and 50 provided in FIG. 3 do not have to be equally strong and/or have the same dimensions, and in the same way the units 40 and 42 do not have to have the same actuation-related dimensions or symmetrical hysteresis behavior. Instead, it is possible, for example, to replace the shown pair of permanent magnets with a (common) permanent magnet which is suitably positioned centrally or asymmetrically between the pair of expansion units, in the same way that asymmetry of the permanent-magnetically or electromagnetically generated field can be deliberately planned.

According to the development, it is not necessary, for example, to set the permanent magnetic field strength (in the sense of biasing) such that it is central or symmetrical with respect to the hysteresis of FIG. 4. If, for example, the permanent magnetic field strength is selected to be smaller (for example of the order of magnitude of the half of $B_0$), one of the expansion units can then advantageously be shortened during the current pulse as early as at a lower field strength and therefore take place earlier than the expansion of the other unit. Depending on the desired switching behavior, advance switching or gradation can be achieved: if, for example, a stable position of the actuator switches off the flow through a driven locking valve against a pressure, the reduction in the holding force can initiate the switching process by virtue of the excess pressure before the other expansion unit actively assists the switching process.

In addition, an application requirement that, in addition to the spring prestress, different torques and/or forces act on an extended expansion unit in both stable actuating positions can be effectively counteracted by selecting or setting up (permanent magnetic) fields (bias fields) of correspondingly different magnitudes; switching in the direction with greater loading is therefore simplified compared to the reverse process and the effect of an asymmetrically acting force is compensated for by the output partner.

The invention claimed is:

1. Actuator apparatus comprising a drive element tiltable in a predetermined manner in response to electrical activation and which is contacted by an output partner in order to transmit mechanical drive energy, the drive element, as a connection element, is operatively connected to two expansion units, which are formed by means of magnetic shape-memory alloy material, such that the connection element executes a tilting and/or pivoting movement in response to an expansion or contraction movement of one of the expansion units, said expansion or contraction movement being produced by the electrical activation and also a magnetic field which is generated by said electrical activation, wherein the magnetic field is generated in a direction perpendicular to a direction of the expansion or contraction movement.

2. Apparatus according to claim 1, wherein the drive element is realized as a tilting lever which can pivot about a rotary shaft, in each case one of the expansion units acting directly or indirectly on said tilting level at both ends of the rotary shaft.

3. Apparatus according to claim 1, wherein the expansion units are designed such that an expansion or contraction movement executed by said expansion units renders possible the tilting movement through an angle of <180°.

4. Apparatus according to claim 1, wherein at least one of the expansion units is designed such that the tilting movement can be produced in bistable end positions.

5. Apparatus according to claim 4, wherein the bistable end positions are kept in a powerless state by magnetic field means which are associated with the expansion units.

6. Apparatus according to claim 1, wherein the expansion units are designed to set predetermined intermediate positions along a tilting and/or pivoting path of the tilting movement.

7. Apparatus according to claim 1, wherein the expansion units have a magnetic field means which has an associated permanent magnet unit.

8. Apparatus according to claim 7, wherein the magnetic field means which are associated with the expansion units have a coil unit which is supplied with power by the electrical activation.

9. Apparatus according to claim 8, wherein a coil unit is provided for each of the expansion units.

10. Apparatus according to claim 8, wherein a common coil unit is provided for the expansion units.

11. Apparatus according to claim 1, wherein the magnetic shape-memory alloy material is selected from the group consisting of NiMnGa, NiMnFeGa, NiFeGa and FePd.

* * * * *